United States Patent
Kim et al.

(10) Patent No.: US 11,271,039 B2
(45) Date of Patent: Mar. 8, 2022

(54) ELECTRONIC DEVICE AND METHOD FOR FABRICATING THE SAME

(71) Applicant: SK hynix Inc., Icheon (KR)

(72) Inventors: Chi-Ho Kim, Yongin (KR); Min-Seon Kang, Icheon (KR); Hyun-Seok Kang, Icheon (KR); Hyo-June Kim, Seoul (KR); Jae-Geun Oh, Seoul (KR); Su-Jin Chae, Icheon (KR)

(73) Assignee: SK hynix Inc., Icheon (KR)

( * ) Notice: Subject to any disclaimer, the term of this patent is extended or adjusted under 35 U.S.C. 154(b) by 154 days.

(21) Appl. No.: 16/711,264

(22) Filed: Dec. 11, 2019

(65) Prior Publication Data

US 2020/0373353 A1 Nov. 26, 2020

(30) Foreign Application Priority Data

May 22, 2019 (KR) .......................... 10-2019-0060003

(51) Int. Cl.
*H01L 27/24* (2006.01)
*H01L 45/00* (2006.01)

(52) U.S. Cl.
CPC .............. *H01L 27/24* (2013.01); *H01L 45/06* (2013.01); *H01L 45/1608* (2013.01); *H01L 45/1675* (2013.01); *H01L 45/1683* (2013.01)

(58) Field of Classification Search
CPC . H01L 27/24; H01L 27/2409; H01L 27/2427; H01L 27/2463; H01L 45/06; H01L 45/1608; H01L 45/1675; H01L 45/1683; H01L 45/1233
See application file for complete search history.

(56) References Cited

U.S. PATENT DOCUMENTS

| | | | |
|---|---|---|---|
| 7,977,662 B2* | 7/2011 | Ryoo | H01L 45/1233 257/5 |
| 9,231,205 B2* | 1/2016 | Yang | H01L 27/2463 |
| 9,412,581 B2 | 8/2016 | Thadani et al. | |
| 2014/0258626 A1* | 9/2014 | Kang | H01L 27/222 711/125 |
| 2018/0309051 A1* | 10/2018 | Deshpande | H01L 21/76819 |
| 2020/0127053 A1* | 4/2020 | Chen | H01L 43/12 |

FOREIGN PATENT DOCUMENTS

KR 101148693 B1 5/2012

* cited by examiner

*Primary Examiner* — Allison Bernstein

(57) ABSTRACT

This technology provides an electronic device and a method for fabricating the same. An electronic device in accordance with an implementation of this document may include a substrate including a first portion in a first region and a second portion in a second region; a plurality of memory cells disposed over the first portion of the substrate; a first insulating layer extending over the second portion of the substrate and at least partially filling a space between adjacent ones of the plurality of memory cells; and a second insulating layer disposed over the first insulating layer. The first insulating layer has a dielectric constant smaller than that of the second insulating layer, a thermal conductivity smaller than that of the second insulating layer, or both.

16 Claims, 11 Drawing Sheets

ELECTRONIC DEVICE AND METHOD FOR FABRICATING THE SAME

CROSS-REFERENCE TO RELATED APPLICATIONS

The present application claims priority to Korean Patent Application No. 10-2019-0060003, entitled "ELECTRONIC DEVICE AND METHOD FOR FABRICATING THE SAME" and filed on May 22, 2019, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multifunctionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a switching characteristic between different resistance states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device and a method for fabricating the same, in which an electronic device includes a semiconductor memory which can improve reliability and fabricating processes.

In an implementation, an electronic device may include a semiconductor memory, wherein the semiconductor memory may include: a substrate including a first portion in a first region and a second portion in a second region; a plurality of memory cells disposed over the first portion of the substrate; a first insulating layer extending over the second portion of the substrate and at least partially filling a space between adjacent ones of the plurality of memory cells; and a second insulating layer disposed over the first insulating layer, and wherein the first insulating layer has a dielectric constant smaller than that of the second insulating layer, a thermal conductivity smaller than that of the second insulating layer, or both.

In another implementation, a method for fabricating an electronic device including a semiconductor memory may include: providing a substrate that includes a first portion in a first region and a second portion in a second region; forming a first insulating layer which extends over the second portion of the substrate and at least partially fills a space between adjacent ones of a plurality of memory cells; forming a second insulating layer over the first insulating layer; and performing a planarization process until upper surfaces of the plurality of memory cells are exposed, wherein the first insulating layer has a dielectric constant smaller than that of the second insulating layer, a thermal conductivity smaller than that of the second insulating layer, or both.

These and other aspects, implementations and associated advantages are described in greater detail in the drawings, the description and the claims.

DETAILED DESCRIPTION

Figure 1:
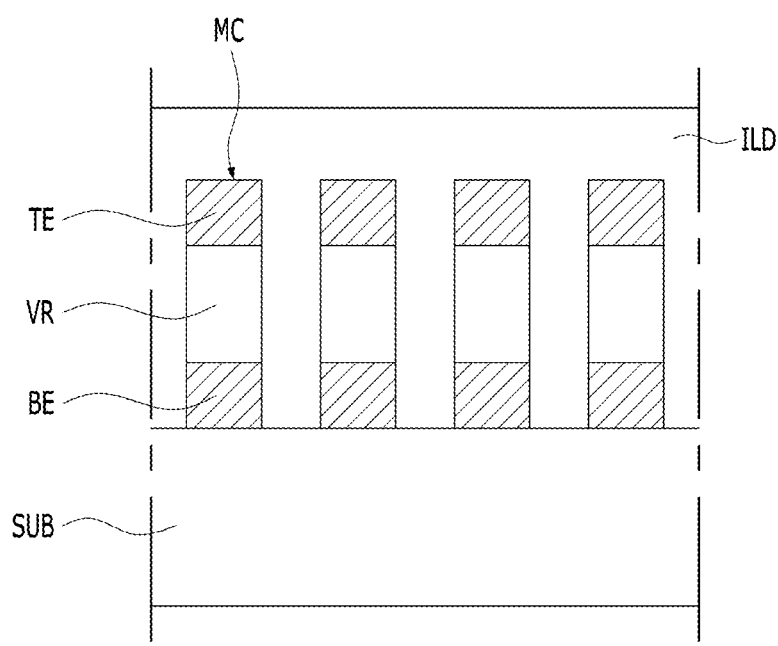
FIG. 1 is a cross-sectional view showing a memory device in accordance with an implementation of the present disclosure.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a cross-sectional view showing a memory device in accordance with an implementation of the present disclosure.

Referring to FIG. 1, the memory device may include a plurality of memory cells MC formed over a substrate SUB in which a lower structure (not shown) is formed.

Each of the memory cells MC may have a structure in which a bottom electrode BE, a variable resistance layer VR, and a top electrode TE are stacked. The variable resistance layer VR may be a data storage element which switches between different resistance states according to a voltage or current applied through the bottom electrode BE and the top electrode TE, thereby storing data. However, the memory cell MC may include another data storage element which stores data using a different mechanism, instead of the variable resistance layer VR having a variable resistance characteristic.

An insulating layer ILD may be formed over the substrate SUB to fill a space between adjacent memory cells MC and isolate the adjacent memory cells MC from each other.

However, as a degree of integration of the memory device increases, the space between the adjacent memory cells MC is reduced, and various issues may occur. For example, leakage of current through the insulating layer ILD may occur between the adjacent memory cells MC. When the memory cell MC is a memory cell (e.g., a phase change memory cell) configured for storing data using heat generation, heat loss through the insulating layer ILD, or heat transfer from the memory cell MC to one or more adjacent memory cells MC, or both may occur. In this case, an operating current may be increased and thermal disturbance may occur. For example, the operating current that flows through the memory cell MC may be increased to compensate for the heat loss through the insulating layer ILD.

In the following implementations, a structure of a cell array region capable of substantially addressing various issues as described above will be proposed, and also, a structure in a peripheral circuit region will be proposed.

FIGS. 2, 3, 4, 5, and 6 are cross-sectional views illustrating a memory device in accordance with an implementation of the present disclosure, and a method for fabricating the same.

First, a fabrication method will be described.

Figure 2:
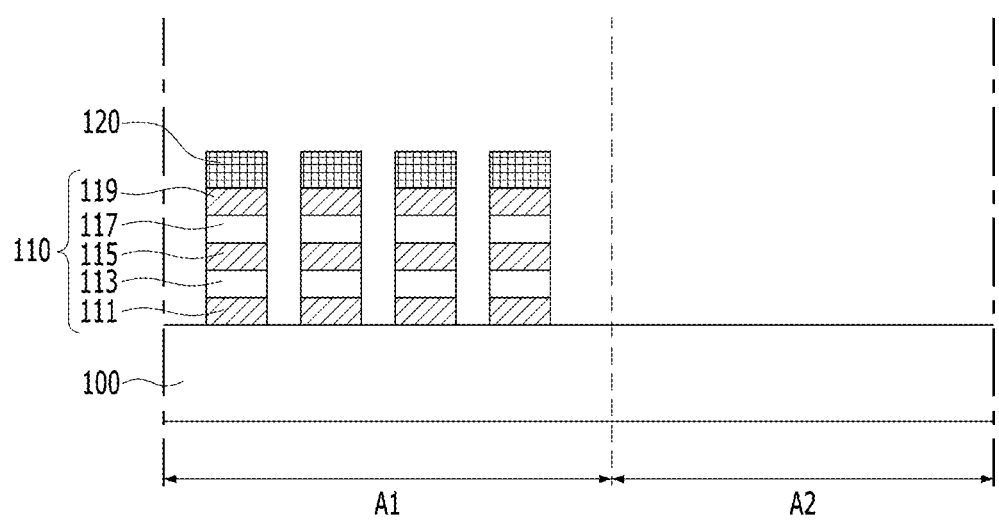
FIGS. 2, 3, 4, 5, and 6 are cross-sectional views illustrating a memory device in accordance with an implementation of the present disclosure, and a method for fabricating the same.

Referring to FIG. 2, a substrate 100 in which a lower structure (not shown) is formed may be provided. The substrate 100 may include a first portion in a first region A1 and a second portion in a second region A2.

The first region A1 may be a cell array region in which a plurality of memory cells 110 are arranged, and the second region A2 may be a peripheral circuit region in which peripheral circuits (not shown) for driving elements in the cell array region A1 are disposed. In this implementation, although the first region A1 and the second region A2 are shown as being adjacent to each other, implementations of the present disclosure are not limited thereto. For example, these regions A1 and A2 may be spaced apart from each other.

Although not shown, the first portion of the substrate 100 in the first region A1 may include wirings such as a word line (not shown) coupled to a lower end of a corresponding one of the memory cells 110 and supplying a voltage or current to the memory cell 110. Also, the second portion of the substrate 100 in the second region A2 may include various peripheral circuits such as a switching transistor (not shown) which controls an access to the word line or a bit line (not shown) of the cell array region, a metal pad (not shown) coupled to a junction of the switching transistor, or a metal line (not shown).

The memory cells 110 may be formed over the first portion of the substrate 100 in the first region A1. Each of the memory cells 110 may include a lower electrode layer 111, a selection element layer 113, an intermediate electrode layer 115, a variable resistance layer 117, and an upper electrode layer 119. The memory cell 110 may be formed by depositing material layers (not shown) respectively corresponding to the lower electrode layer 111, the selection element layer 113, the intermediate electrode layer 115, the variable resistance layer 117, and the upper electrode layer 119 over the substrate 100, forming a hard mask pattern 120 over the material layers, and etching the material layers using the hard mask pattern 120 as an etching barrier. The memory cell 110 may have a columnar shape, and the memory cells 110 may be arranged in a horizontal direction with respect to the orientation of the cross-sectional view of FIG. 2 and a direction passing through the cross-sectional view.

The lower electrode layer 111 may be disposed at the lowermost portion of the memory cell 110 to provide a connection between the memory cell 110 and a portion of the substrate 100, for example, the word line. The lower electrode layer 111 may have a single-layered structure or a multi-layered structure and include a low-resistance conductive material such as a metal or a metal nitride.

The selection element layer 113 may have a threshold switching characteristic for substantially blocking a current when a magnitude of a voltage supplied to upper and lower ends of the selection element layer 113 is less than a predetermined threshold voltage and for allowing a current to abruptly increase when the magnitude of the voltage is equal to or greater than the threshold voltage, and thus control an access to the variable resistance layer 117. The selection element layer 113 may include a diode, an OTS (Ovonic Threshold Switching) material such as a chalcogenide material, an MIEC (Mixed Ionic Electronic Conducting) material such as a metal containing chalcogenide material, an MIT (Metal Insulator Transition) material such as $NbO_2$, $VO_2$, or the like, or a tunneling insulating material having a relatively wide band gap such as $SiO_2$, $Al_2O_3$, or the like.

The intermediate electrode layer 115 may physically separate the selection element layer 113 and the variable resistance layer 117, but electrically connect them. The intermediate electrode layer 115 may have a single-layered structure or a multi-layered structure and include a low-resistance conductive material such as a metal or a metal nitride.

The variable resistance layer 117 may have a variable resistance characteristic that switches between different resistance states depending on a voltage or current supplied to upper and lower ends of the variable resistance layer 117, thereby storing different data. The variable resistance layer 117 may have a single-layered structure exhibiting a variable resistance characteristic alone or a multi-layered structure exhibiting a variable resistance characteristic by a combination of two or more layers. As an example, the variable resistance layer 117 may include a phase change material capable of switching between an amorphous state and a crystalline state by Joule's heat generated according to a current flowing through the variable resistance layer 117. However, implementations of the present disclosure are not limited thereto, and the variable resistance layer 117 may have a single-layered structure or a multi-layered structure and include at least one of materials used for an RRAM, a PRAM, an MRAM, an FRAM, or the like, that is, a metal oxide such as a perovskite-based oxide, a transition metal oxide, or the like, a phase change material such as a chalcogenide-based material, a ferromagnetic material, a ferroelectric material, or the like. Furthermore, the memory cell 110 may use a data storage element storing data by a different manner than the variable resistance layer 117. In an implementation, the variable resistance layer 117 or a data storage element replacing the variable resistance layer 117 may use heat for performing an operation such as a data storage operation.

The upper electrode layer 119 may be disposed at the uppermost portion of the memory cell 110 to provide a connection between the memory cell 110 and a conductive element (not shown) over the memory cell 110, such as a bit line. The upper electrode layer 119 may include a single-layered structure or a multi-layered structure and include a low resistance conductive material such as a metal or a metal nitride.

According to the implementation shown in FIG. 2, the memory cell 110 includes the lower electrode layer 111, the selection element layer 113, the intermediate electrode layer 115, the variable resistance layer 117, and the upper electrode layer 119 which are sequentially stacked. However, a stacking order of the stacked layers 111, 113, 115, 117, and 119 may vary according to implementations. As an example, positions of the selection element layer 113 and the variable resistance layer 117 may be reversed. Alternatively, one or more layers of the stacked layers 111, 113, 115, and 119 may be omitted, as long as the variable resistance layer 117 essential for the data storage remains. Alternatively, a layer (not shown) may be further added to the stacked layers 111, 113, 115, 117, and 119.

Figure 3:
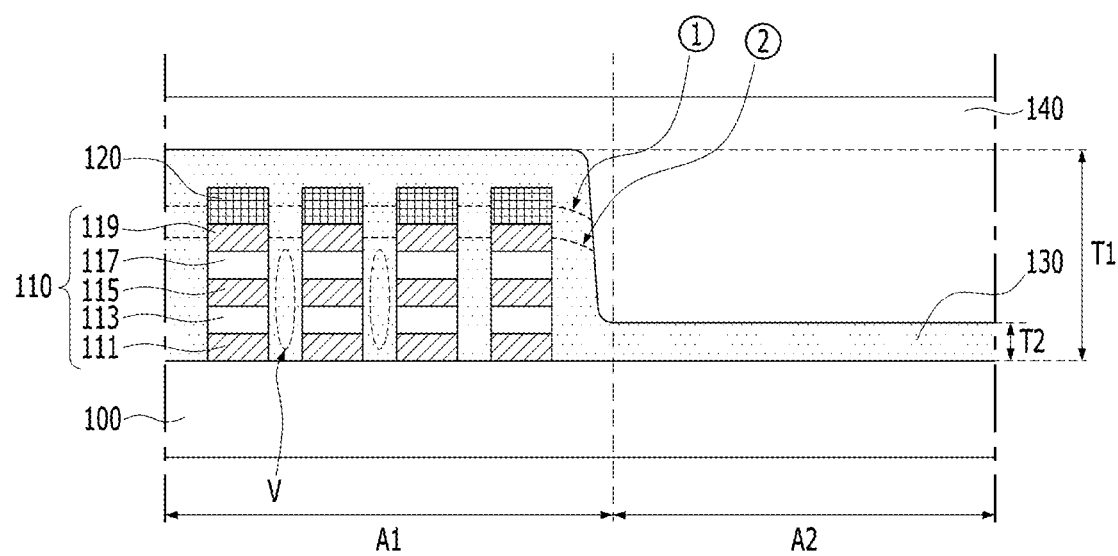

Referring to FIG. 3, a first insulating layer 130 may be formed over the substrate 100. The first insulating layer 130 may be formed in the first region A1 to fill a space between the memory cells MC. Also, the first insulating layer 130 may extend to the second region A2.

The first insulating layer 130 may be formed of a material having a low dielectric constant to reduce a leakage current between the memory cells 110. When the memory cell 110 stores data using heat generation, for example, when the variable resistance layer 117 includes a phase change material, the first insulating layer 130 may be formed of a material having a low thermal conductivity to reduce heat loss from the memory cell 110 or heat transfer from the memory cell 110 to the adjacent memory cells 110. That is, the first insulating layer 130 may be formed of a Low-k (low dielectric constant) material, or a Low-K (low thermal conductivity) material, or both. As an example, the first insulating layer 130 may include an insulating material containing silicon and carbon, such as SiOC, SiOCH, SiOCHN, SiC, SiCON, or SiCN. This insulating material may be a flowable material which will be cured in a subsequent process. In an embodiment, the first insulating layer 130 may be formed using a flowable chemical vapor deposition (FCVD) process. For example, the first insulating layer 130 may be formed by reacting a dielectric precursor having Si—C bonds with an oxidant to form a dielectric material, and then by curing the dielectric material.

The first insulating layer 130 may have a thickness sufficiently large to fill at least a space between the adjacent variable resistance layers 117 in order to prevent the leakage current and/or the heat transfer. Hereinafter, a thickness of the first insulating layer 130 in the first region A1, that is, a distance from an upper surface of the substrate 100 to an uppermost surface of the first insulating layer 130 in the first region A1, may be referred to as a first thickness T1. In the implementation shown in FIG. 3, the first insulating layer 130 may completely fill spaces between stacked structures, each including the memory cell MC and the hard mask pattern 120, and the uppermost surface of the first insulating layer 130 may be located above the hard mask pattern 120, in the first region A1. However, as will be described later, it may be preferable that a thickness of the first insulating layer 130 in the second region A2 is relatively thin. Considering this, the thickness of the first insulating layer 130 in the first region A1 may be reduced as long as the first insulating layer 130 exists at least between the adjacent variable resistance layers 117. For example, the uppermost surface of the first insulating layer 130 may be lower than an upper surface of the hard mask pattern 120 as indicated by a first dotted line ①, or the uppermost surface of the first insulating layer 130 may be lower than an upper surface of the upper electrode layer 119 as indicated by a second dotted line ②. In these examples indicated by the first and second dotted lines ① and ②, the uppermost surface of the first insulating layer 130 may be higher than an upper surface of the variable resistance layer 117. Furthermore, a void V may be present in the first insulating layer 130. Since the vacuum in the void V has a relatively low dielectric constant, or a relatively low thermal conductivity, or both, the void V may enhance a function of preventing the leakage current, or the heat transfer, or both, together with the first insulating layer 130.

Here, the memory cell MC having a predetermined height is formed in the first region A1 but the memory cell MC does not exist in the second region A2. Therefore, the thickness of the first insulating layer 130 in the second region A2 may be smaller than that in the first region A1. Hereinafter, the thickness of the first insulating layer 130 in the second region A2 will be referred to as a second thickness T2. Since the first insulating layer 130 is formed in the first and second regions A1 and A2 together, the first insulating layer 130 may exist in the second region A2 unless a separate process to remove a portion of the first insulating layer 130 in the second region A2 is performed, but the second thickness T2 may be desirable to be as thin as possible. This is because the material, which is used for the first insulating layer 130 and has a low dielectric constant, or a low thermal conductivity, or both, has higher shrinkage during a curing process than that of the second insulating layer 140, which is to be formed in a subsequent process and includes a silicon oxide, thereby causing stress. In order for the stress generated by the first insulating layer 130 to be at or below a level similar to that of a silicon oxide, the second thickness T2 may be adjusted to 500 Å or less while exceeding 0 Å. For example, because the first insulating layer 130 shrinks more than the second insulating layer 140 during a curing process, a tensile stress may be exerted on the first insulating layer 130 during the curing process, thereby leading to an occurrence of one or more cracks in the first insulating layer 130. When the second thickness T2 of the first insulating layer 130 is adjusted to be equal to or less than 500 Å, the tensile stress exerted on the insulating layer 130 may be kept at a level sufficiently low to suppress such an occurrence of the cracks.

In summary, in the implementation shown in FIG. 3, the first insulating layer 130 may be formed in both of the first region A1 and the second region A2, but the first thickness T1 of the first insulating layer 130 in the first region A1 may satisfy a first condition that the first insulating layer 130 fills a part or substantially all of the space between the variable resistance layers 117, and the second thickness T2 of the first insulating layer 130 in the second region A2 may be preferably as thin as possible on the premise of satisfying the first condition. The second thickness T2 may be preferably 500 Å or less, but may be thicker than 500 Å to satisfy the first condition.

Subsequently, the second insulating layer 140 may be formed over the first insulating layer 130. The second insulating layer 140 may include a silicon oxide and may have a higher dielectric constant, or a higher thermal conductivity, or both than the first insulating layer 130. An upper surface of the second insulating layer 140 in the first region A1 and the second region A2 may be located over the upper surface of the first insulating layer 130 so as to compensate for a step difference between the first region A1 and the second region A2.

Figure 4:
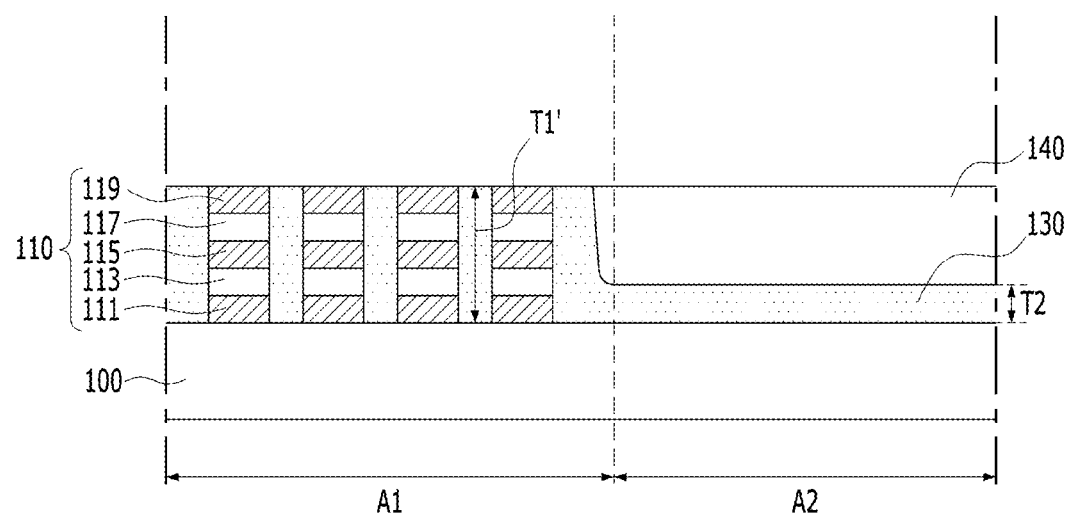

Referring to FIG. 4, a planarization process, for example, a chemical mechanical polishing (CMP) process, may be performed on the resultant structure of FIG. 3 until the upper surface of the memory cell 110, for example, the upper surface of the upper electrode layer 119 is exposed. As a result, in the first region A1, the first insulating layer 130 may be present between the memory cells 110 while having a third thickness T1' substantially the same as a thickness of the memory cell 110. Also, in the second region A2, the first insulating layer 130 has the second thickness T2, and the second insulating layer 140 has a thickness corresponding to a difference between the third thickness T1' and the second thickness T2 and is formed over the first insulating layer 130. In the second region A2, the thickness of the second insulating layer 140 may be greater than the second thickness T2 of the first insulating layer 130.

Figure 5:
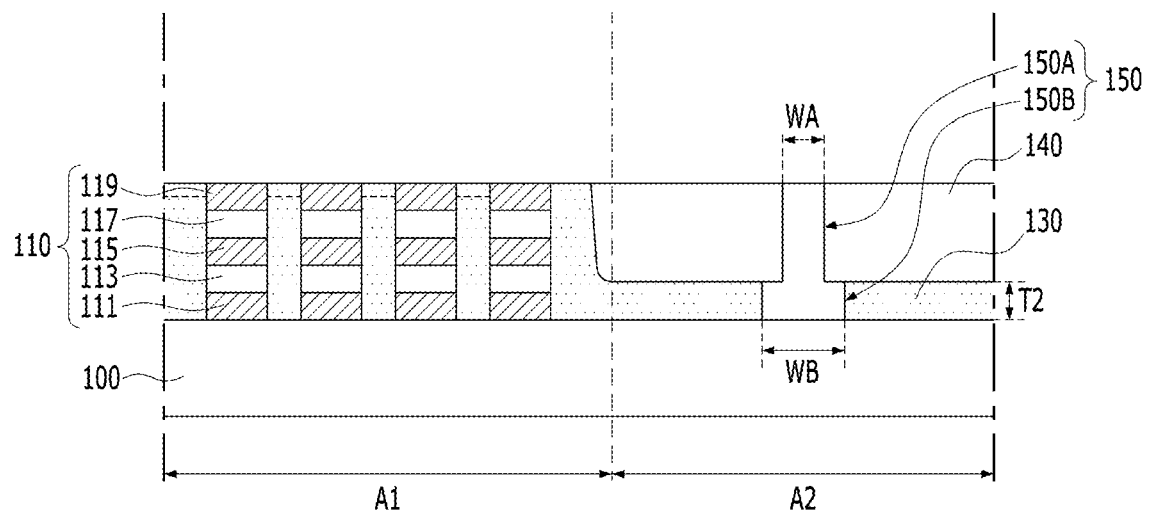

Referring to FIG. 5, the first insulating layer 130 and the second insulating layer 140 in the second region A2 may be selectively etched to form a contact hole 150. The contact hole 150 may expose a part of the substrate 100, for example, a junction of a switching transistor, a metal pad, or a metal line. The contact hole 150 may be formed by an anisotropic etching, such as a dry etching.

Here, the first insulating layer 130 may be a low-k material, or a low-K material, or both, and these materials may have a higher etching rate than the second insulating layer 140 formed of a silicon oxide or the like during an anisotropic etching process (e.g., a dry etching process). Accordingly, the etching rate of the first insulating layer 130 is greater than the etching rate of the second insulating layer 140 during the etching process for forming the contact hole 150. Therefore, a width of a lower portion of the contact hole 150 may become larger than a width of an upper portion of the contact hole 150. In other words, a width WB of a second contact hole 150B formed in the first insulating layer 130 may larger than a width WA of a first contact hole 150A formed in the second insulating layer 140.

Figure 6:
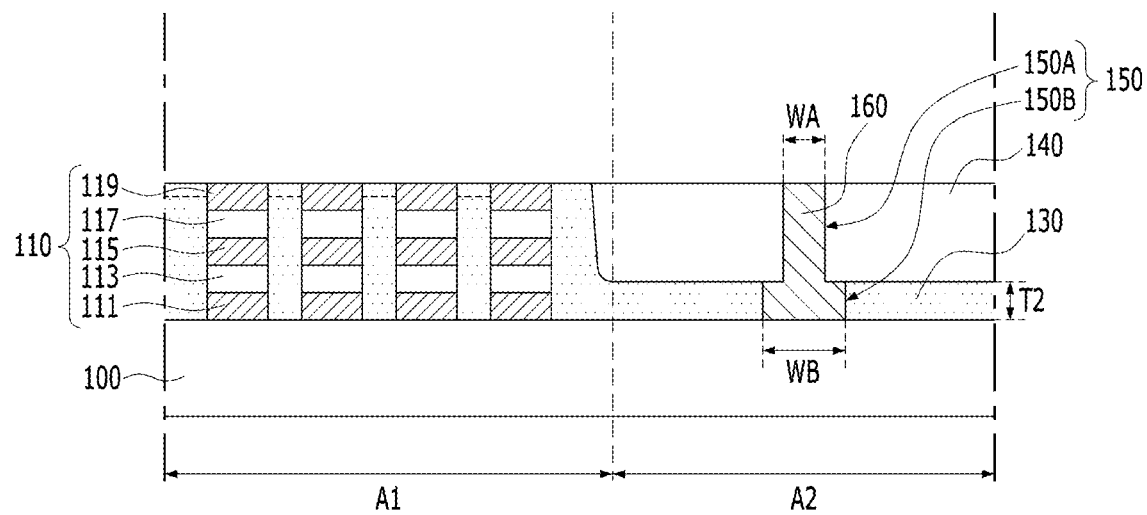

Referring to FIG. 6, the contact hole 150 may be filled with a conductive material such as a metal or metal nitride to form the contact plug 160.

Here, since the contact plug 160 has a lower portion having a relatively wide width according to a shape of the contact hole 150 described above, it may be easy to connect a part of the substrate 100, for example, a junction of a switching transistor, a pad, or a line with the contact plug 160.

By the above-described processes, the memory device shown in FIG. 6 may be fabricated.

Referring again to FIG. 6, the memory device of according to an implementation of the present disclosure may include the substrate 100 including the first portion in the first region A1 and the second portion in the second region A2, the memory cells 110 formed over the first portion of the substrate 100 in the first region A1 and spaced apart from each other, the first insulating layer 130 filling at least a portion of a space between the memory cells 110 and extending over the second portion of the substrate 100 in the second region A2, the second insulating layer 140 formed over the first insulating layer 130 in the second region A2, and the contact plug 160 penetrating the first and second insulating layers 130 and 140 in the second region A2 to be connected to a portion of the substrate 100.

Here, the first insulating layer 130 may include a material having a relatively low dielectric constant, or a relatively low thermal conductivity, or both. For example, the first insulating layer 130 may include a material having a lower dielectric constant, or a lower thermal conductivity, or both than the second insulating layer 140. The second insulating layer 140 may include a silicon oxide. In addition, the first insulating layer 130 may have a higher etching rate than the second insulating layer 140.

The thickness (e.g., the third thickness T1' in FIG. 4) of the first insulating layer 130 in the first region A1 may be greater than the thickness T2 of the first insulating layer 130 in the second region A2. In addition, the thickness T2 of the first insulating layer 130 may be smaller than the thickness of the second insulating layer 140 in the second region A2.

The contact plug 160 may have a first portion penetrating the first insulating layer 130 and a second portion penetrating the second insulating layer 140. A width WB of the first portion may be larger than a width WA of the second portion.

According to the memory device and the fabricating method thereof described above, the following beneficial aspects may be obtained.

First, the first insulating layer 130 having a relatively low dielectric constant, or a relatively low thermal conductivity, or both, exists between the memory cells 110, thereby reducing the leakage current or the heat transfer/heat loss through the first insulating layer 130. As a result, the reliability of the memory device may be increased.

In addition, since the thickness T2 of the first insulating layer 130 extending over the second portion of the substrate 100 in the second region A2 has a thickness less than a given value, an additional process such as reducing the thickness of the first insulating layer 130 or removing the first insulating layer 130 in the second region A2 may not be performed to address stress-related issues. Therefore, process difficulty may be reduced and the process may be simplified.

Furthermore, since the first insulating layer 130 includes the material having a higher etching rate than that of the second insulating layer 140, the lower width WB of the contact plug 160 formed in the first insulating layer 130 over the second portion of the substrate 100 in the second region A2 may be easily increased without performing an additional process. As a result, the contact plug 160 may be easily aligned with a component which is located below the contact plug 160 and contacts the contact plug 160.

Meanwhile, according to an implementation of the present disclosure, two or more memory cells may be stacked in a vertical direction. This will be described by way of example with reference to FIG. 7.

Figure 7:
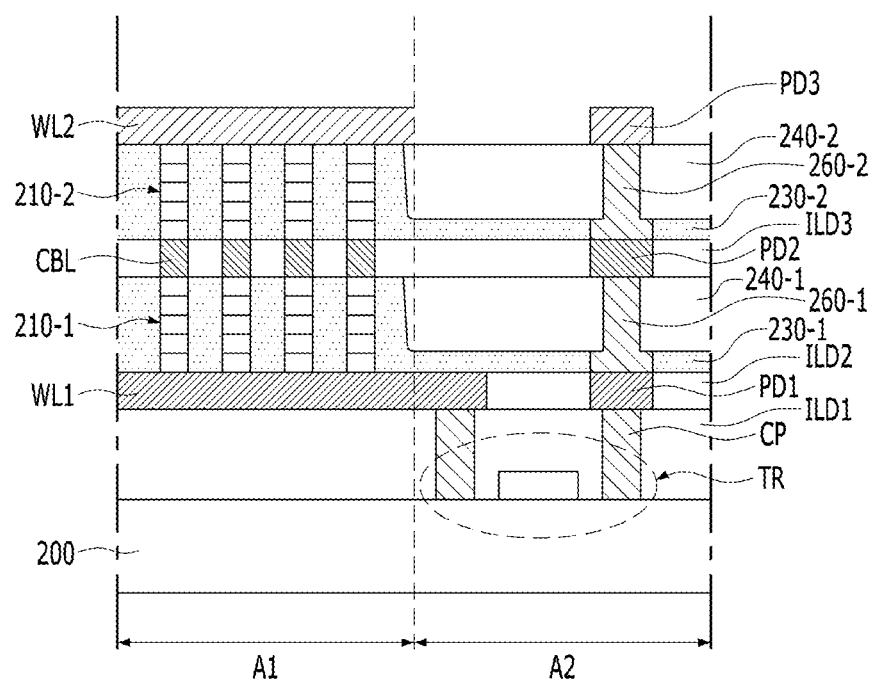
FIG. 7 is a cross-sectional view illustrating a memory device in accordance with an implementation of the present disclosure, and a method for fabricating the same.

FIG. 7 is a cross-sectional view for illustrating a memory device in accordance with an implementation of the present disclosure, and a method for fabricating the same. Detailed descriptions of substantially the same parts as the above-described implementation will be omitted.

Referring to FIG. 7, the memory device may include a semiconductor substrate 200 including a first portion in a first region A1 where a plurality of memory cells are arranged and a second portion in a second region A2 where a peripheral circuit is disposed.

A transistor TR may be provided over the second portion of the semiconductor substrate 200 in the second region A2.

Specifically, in the second region A2, a gate which is a part of the transistor TR and is insulated from the semiconductor substrate 200 by a gate insulating layer may be formed over the semiconductor substrate 200, and junction regions (not shown) may be formed in the semiconductor substrate 200 on both sides of the gate. The junction regions may be formed by doping impurities. Contact plugs CP may be formed over these junction regions, respectively. The contact plugs CP may pass through the first interlayer insulating layer ILD1, which covers the semiconductor substrate 200 on which the transistor TR is formed, and the contact plugs CP may be connected to both junctions of the transistor TR.

A first word line WL1 extending in a first direction and a first pad PD1 spaced apart from the first word line WL1 may be provided over the first interlayer insulating layer ILD1. The first direction may be parallel to a horizontal direction with respect to the orientation of the cross-sectional view of FIG. 7. The first word line WL1 may cross the first region A1 and extend to a part of the second region A2 to be connected to a first one of the contact plugs CP. The first pad PD1 may be formed in the second region A2 to be connected to a second one of the contact plugs CP. A space between the first word line WL1 and the first pad PD1 may be filled with a second interlayer insulating layer ILD2.

A first stack which includes a plurality of memory cells 210-1 connected to the first word line WL1, a first insulating layer 230-1 filling at least a portion of a space between the memory cells 210-1 and extending to the second region A2, a second insulating layer 240-1 formed over the first insulating layer 230-1 in the second region A2, and a contact plug 260-1 penetrating the first and second insulating layers 230-1 and 240-1 to be connected with the first pad PD1, may be provided over the first word line WL1, the first pad PD1, and the second interlayer insulating layer ILD2. The first stack may be formed by processes substantially the same as the above-described processes with reference to FIGS. 2 to 6.

A common bit line CBL and a second pad PD2 which extend in a second direction may be provided over the first stack. The second direction may be perpendicular to the cross-sectional view of FIG. 7. Although not shown, the common bit line CBL may cross the first region A1 and extend to a part of the second region A2 to be connected to a specific contact plug. The second pad PD2 may be formed in the second region A2 to be connected to the contact plug 260-1 of the first stack. A space between the common bit line CBL and the second pad PD2 may be filled with a third interlayer insulating layer ILD3.

A second stack which includes a plurality of memory cells 210-2 connected to the common bit line CBL, a third insulating layer 230-2 filling at least a portion of a space between the memory cells 210-2 and extending to the second region A2, a fourth insulating layer 240-2 formed over the first insulating layer 230-2 in the second region A2, and a contact plug 260-2 penetrating the third and fourth insulating layers 230-2 and 240-2 to be connected with the second pad PD2, may be formed over the common bit line CBL, the second pad PD2, and the third interlayer insulating layer ILD3. The second stack may also be formed by processes substantially the same as the above-described processes with reference to FIGS. 2 to 6.

The stacked structure from the first word line WL1 to the second stack may be repeated over the second stack. For example, a second word line WL2 extending in the same direction as the first word line WL1 to overlap the first word line WL1 and a third pad PD3 coupled to the contact plug 260-2 of the second stack may be provided over the second stack.

The above and other memory circuits or semiconductor devices based on the disclosed technology can be used in a range of devices or systems. FIGS. 8-12 provide some examples of devices or systems that can implement the memory circuits disclosed herein.

Figure 8:
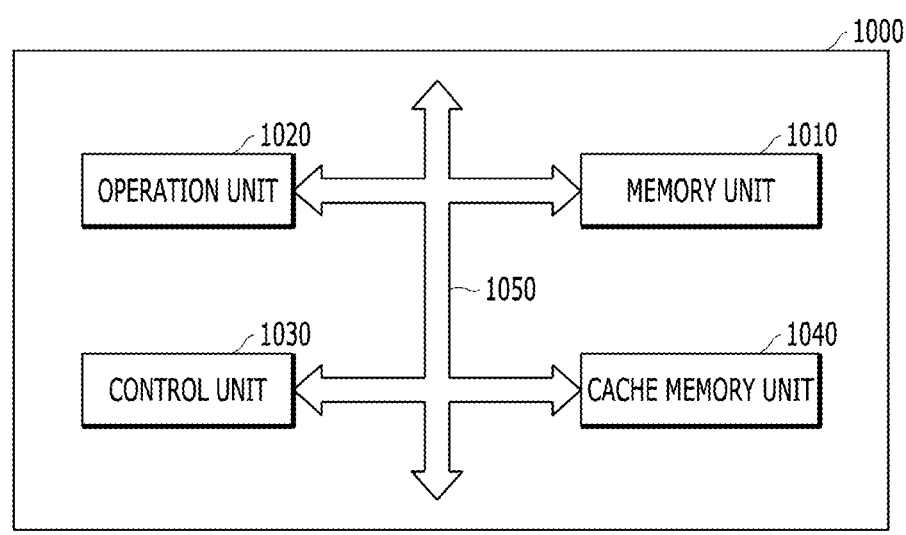
FIG. 8 is an example of configuration diagram of a microprocessor implementing memory circuitry based on the disclosed technology.

FIG. 8 is an example of configuration diagram of a microprocessor implementing memory circuitry based on the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a substrate including a first portion in a first region and a second portion in a second region; a plurality of memory cells disposed over the first portion of the substrate; a first insulating layer extending over the second portion of the substrate and at least partially filling a space between adjacent ones of the plurality of memory cells; and a second insulating layer disposed over the first insulating layer, and wherein the first insulating layer has a dielectric constant smaller than that of the second insulating layer, a thermal conductivity smaller than that of the second insulating layer, or both. Through this, reliability of the memory unit 1010 may be improved and fabricating processes may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
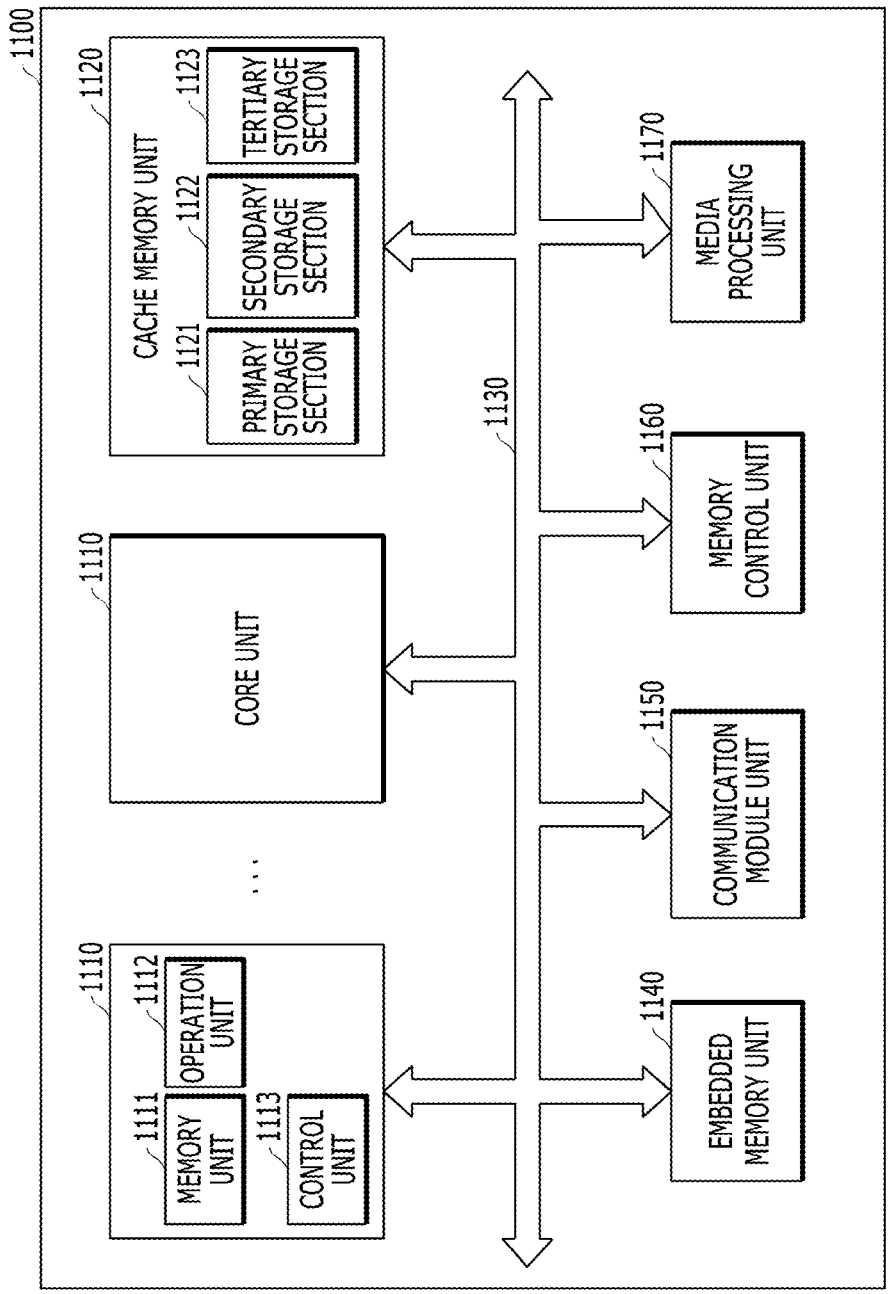
FIG. 9 is an example of configuration diagram of a processor implementing memory circuitry based on the disclosed technology.

FIG. 9 is an example of configuration diagram of a processor implementing memory circuitry based on the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a substrate including a first portion in a first region and a second portion in a second region; a plurality of memory cells disposed over the first portion of the substrate; a first insulating layer extending over the second portion of the substrate and at least partially filling a space between adjacent ones of the plurality of memory cells; and a second insulating layer disposed over the first insulating layer, and wherein the first insulating layer has a dielectric constant smaller than that of the second insulating layer, a thermal conductivity smaller than that of the second insulating layer, or both. Through this, reliability of the cache memory unit 1120 and fabricating processes may be improved. As a consequence, operating characteristics of the processor 1100 may be improved.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
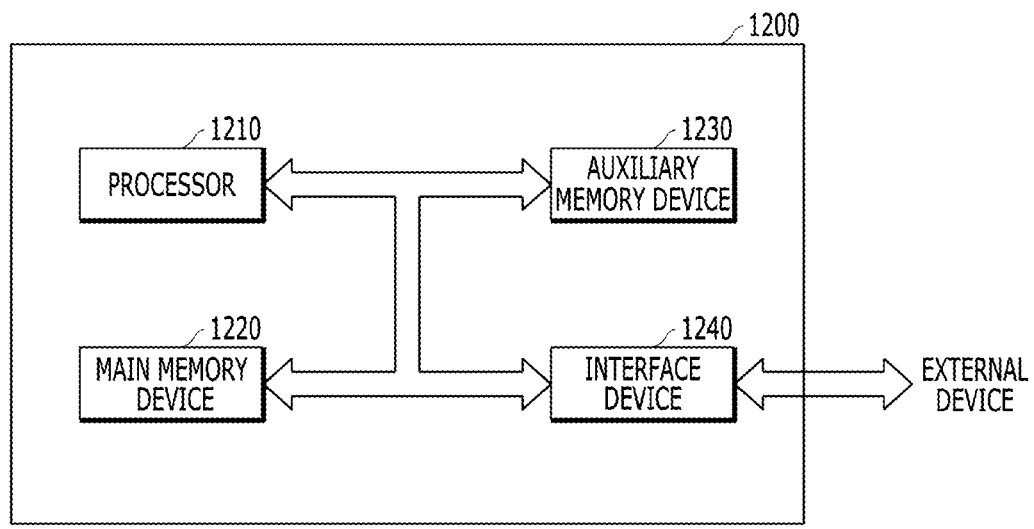
FIG. 10 is an example of configuration diagram of a system implementing memory circuitry based on the disclosed technology.

FIG. 10 is an example of configuration diagram of a system implementing memory circuitry based on the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a substrate including a first portion in a first region and a second portion in a second region; a plurality of memory cells disposed over the first portion of the substrate; a first insulating layer extending over the second portion of the substrate and at least partially filling a space between adjacent ones of the plurality of memory cells; and a second insulating layer disposed over the first insulating layer, and wherein the first insulating layer has a dielectric constant smaller than that of the second insulating layer, a thermal conductivity smaller than that of the second insulating layer, or both. Through this, reliability of the main memory device 1220 and fabricating processes may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a substrate including a first portion in a first region and a second portion in a second region; a plurality of memory cells disposed over the first portion of the substrate; a first insulating layer extending over the second portion of the substrate and at least partially filling a space between adjacent ones of the plurality of memory cells; and a second insulating layer disposed over the first insulating layer, and wherein the first insulating layer has a dielectric constant smaller than that of the second insulating layer, a thermal conductivity smaller than that of the second insulating layer, or both. Through this, reliability of the auxiliary memory device 1230 and fabricating processes may be improved. As a consequence, operating characteristics of the system 1200 may be improved.

Also, the auxiliary memory device 1230 may further include a data storage system (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 11) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
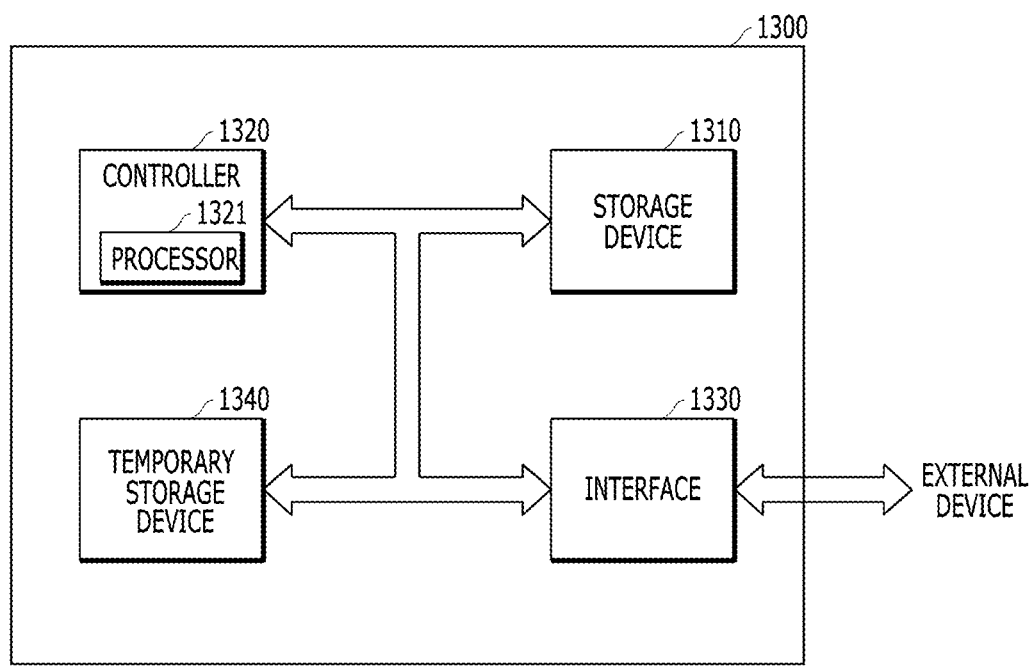
FIG. 11 is an example of configuration diagram of a data storage system implementing memory circuitry based on the disclosed technology.

FIG. 11 is an example of configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a substrate including a first portion in a first region and a second portion in a second region; a plurality of memory cells disposed over the first portion of the substrate; a first insulating layer extending over the second portion of the substrate and at least partially filling a space between adjacent ones of the plurality of memory cells; and a second insulating layer disposed over the first insulating layer, and wherein the first insulating layer has a dielectric constant smaller than that of the second insulating layer, a thermal conductivity smaller than that of the second insulating layer, or both. Through this, reliability of the storage device 1310 or the temporary storage device 1340 and fabricating processes may be improved. As a consequence, operating characteristics and data storage characteristics of the data storage system 1300 may be improved.

Figure 12:
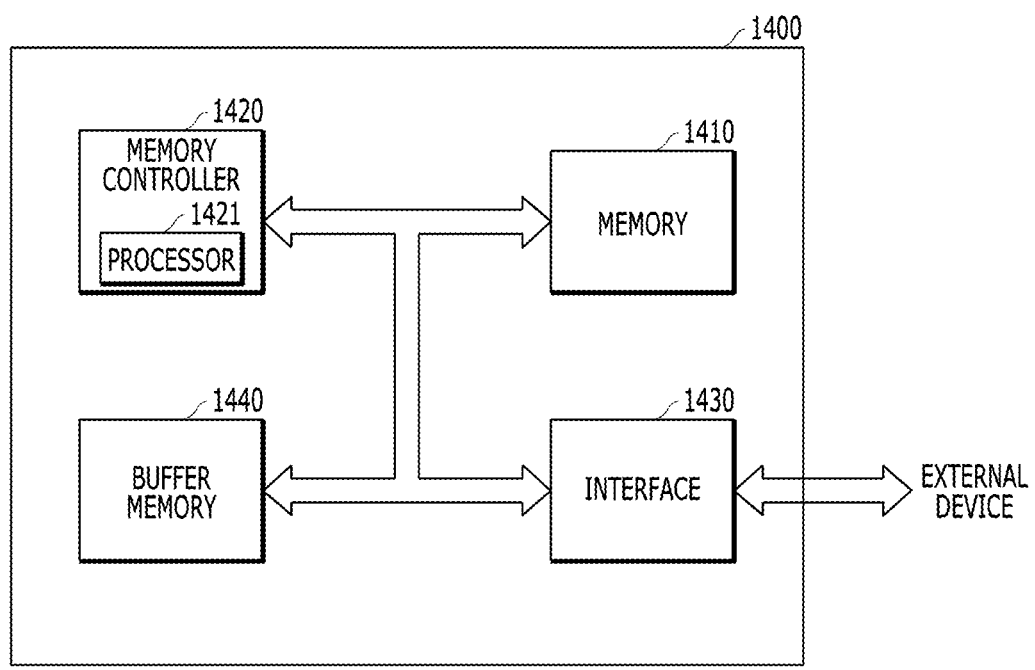
FIG. 12 is an example of configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a substrate including a first portion in a first region and a second portion in a second region; a plurality of memory cells disposed over the first portion of the substrate; a first insulating layer extending over the second portion of the substrate and at least partially filling a space between adjacent ones of the plurality of memory cells; and a second insulating layer disposed over the first insulating layer, and wherein the first insulating layer has a dielectric constant smaller than that of the second insulating layer, a thermal conductivity smaller than that of the second insulating layer, or both. Through this, reliability of the memory 1410 and fabricating processes may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a substrate including a first portion in a first region and a second portion in a second region; a plurality of memory cells disposed over the first portion of the substrate; a first insulating layer extending over the second portion of the substrate and at least partially filling a space between adjacent ones of the plurality of memory cells; and a second insulating layer disposed over the first insulating layer, and wherein the first insulating layer has a dielectric constant smaller than that of the second insulating layer, a thermal conductivity smaller than that of the second insulating layer, or both. Through this, reliability of the buffer memory 1440 and fabricating processes may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements, and variations can be made based on what is described and illustrated in this patent document.

What is claimed is:

1. An electronic device comprising a semiconductor memory, wherein the semiconductor memory comprises:
    a substrate including a first portion in a first region and a second portion in a second region;
    a plurality of memory cells disposed over the first portion of the substrate;
    a first insulating layer extending over the second portion of the substrate and at least partially filling a space between adjacent ones of the plurality of memory cells;
    a second insulating layer disposed over the first insulating layer; and
    a contact plug penetrating the second insulating layer and the first insulating layer in the second region,
    wherein the first insulating layer has a dielectric constant smaller than that of the second insulating layer, a thermal conductivity smaller than that of the second insulating layer, or both, and
    wherein a width of a first portion of the contact plug that penetrates the first insulating layer is larger than a width of a second portion of the contact plug that penetrates the second insulating layer.

2. The electronic device according to claim 1, wherein a thickness of the first insulating layer in the second region is smaller than that of the first insulating layer in the first region.

3. The electronic device according to claim 1, wherein a thickness of the first insulating layer in the second region is smaller than a thickness of the second insulating layer.

4. The electronic device according to claim 1, wherein the first insulating layer has an etching rate higher than that of the second insulating layer.

5. The electronic device according to claim 1, wherein the first insulating layer includes silicon and carbon, and
    wherein the second insulating layer includes silicon oxide.

6. The electronic device according to claim 5, wherein the first insulating layer includes SiOC, SIOCH, SiOCHN, SiC, SiCON, or SiCN.

7. The electronic device according to claim 1, wherein each of the plurality of memory cells includes a phase change material.

8. The electronic device according to claim 1, further comprising a microprocessor which includes:
    a control unit configured to receive a signal including a command from an outside of the microprocessor, and performs extracting, decoding of the command, or controlling input or output of a signal of the microprocessor;
    an operation unit configured to perform an operation based on a result that the control unit decodes the command; and
    a memory unit configured to store data for performing the operation, data corresponding to a result of performing the operation, or an address of data for which the operation is performed,
    wherein the semiconductor memory is part of the memory unit in the microprocessor.

9. The electronic device according to claim 1, further comprising a processor which includes:
    a core unit configured to perform, based on a command inputted from an outside of the processor, an operation corresponding to the command, by using data;
    a cache memory unit configured to store data for performing the operation, data corresponding to a result of performing the operation, or an address of data for which the operation is performed; and
    a bus interface connected between the core unit and the cache memory unit, and configured to transmit data between the core unit and the cache memory unit,
    wherein the semiconductor memory is part of the cache memory unit in the processor.

10. The electronic device according to claim 1, further comprising a processing system which includes:
    a processor configured to decode a command received by the processor and control an operation for information based on a result of decoding the command;
    an auxiliary memory device configured to store a program for decoding the command and the information;
    a main memory device configured to call and store the program and the information from the auxiliary memory device such that the processor can perform the operation using the program and the information when executing the program; and
    an interface device configured to perform communication between at least one of the processor, the auxiliary memory device and the main memory device and the outside,
    wherein the semiconductor memory is part of the auxiliary memory device or the main memory device in the processing system.

11. The electronic device according to claim 1, further comprising a data storage system which includes:
    a storage device configured to store data and conserve stored data regardless of power supply;
    a controller configured to control input and output of data to and from the storage device according to a command inputted from an outside;
    a temporary storage device configured to temporarily store data exchanged between the storage device and the outside; and
    an interface configured to perform communication between at least one of the storage device, the controller and the temporary storage device and the outside,
    wherein the semiconductor memory is part of the storage device or the temporary storage device in the data storage system.

12. The electronic device according to claim 1, further comprising a memory system which includes:
    a memory configured to store data and conserve stored data regardless of power supply;
    a memory controller configured to control input and output of data to and from the memory according to a command inputted from an outside;
    a buffer memory configured to buffer data exchanged between the memory and the outside; and
    an interface configured to perform communication between at least one of the memory, the memory controller and the buffer memory and the outside,
    wherein the semiconductor memory is part of the memory or the buffer memory in the memory system.

13. A method for fabricating an electronic device including a semiconductor memory, the method comprising:
    providing a substrate that includes a first portion in a first region and a second portion in a second region;

forming a first insulating layer which extends over the second portion of the substrate and at least partially fills a space between adjacent ones of a plurality of memory cells;

forming a second insulating layer over the first insulating layer;

performing a planarization process until upper surfaces of the plurality of memory cells are exposed;

forming a contact hole by etching the second insulating layer and the first insulating layer in the second region; and forming a contact plug by filling the contact hole with a conductive material, wherein the first insulating layer has a dielectric constant smaller than that of the second insulating layer, a thermal conductivity smaller than that of the second insulating layer, or both, wherein an etching rate of the first insulating layer is higher than an etching rate of the second insulating layer, and wherein a width of a first portion of the contact hole that penetrates the first insulating layer is larger than a width of a second portion of the contact hole that penetrates the second insulating layer.

14. The method according to claim 13, wherein the plurality of memory cells including a plurality of variable resistance layers, respectively, and wherein forming the first insulating layer includes:

adjusting a thickness of the first insulating layer in the second region to a given value or less while filling at least a part of a space between adjacent ones of the plurality of variable resistance layers.

15. The method according to claim 13, wherein the first insulating layer includes silicon and carbon, and wherein the second insulating layer includes silicon oxide.

16. The method according to claim 13, wherein the first insulating layer includes SiOC, SIOCH, SiOCHN, SiC, SiCON, or SiCN.

* * * * *